(12) United States Patent
Hwang

(10) Patent No.: US 7,696,033 B2
(45) Date of Patent: Apr. 13, 2010

(54) METHOD OF FABRICATING COMPLEMENTARY METAL-OXIDE SEMICONDUCTOR (CMOS) THIN FILM TRANSISTOR (TFT)

(75) Inventor: Eui-Hoon Hwang, Suwon-si (KR)

(73) Assignee: Samsung Mobile Display Co., Ltd., San #24 Nongseo-Dong, Giheung-Gu, Yongin, Gyunggi-Do (KR)

( * ) Notice: Subject to any disclaimer, the term of this patent is extended or adjusted under 35 U.S.C. 154(b) by 325 days.

(21) Appl. No.: 11/878,302

(22) Filed: Jul. 23, 2007

(65) Prior Publication Data

US 2008/0044958 A1 Feb. 21, 2008

(30) Foreign Application Priority Data

Aug. 17, 2006 (KR) ...................... 10-2006-0077511

(51) Int. Cl.
*H01L 21/8238* (2006.01)

(52) U.S. Cl. ............... 438/199; 438/948; 257/E21.027; 257/E21.035; 257/E21.036

(58) Field of Classification Search ................. 438/153, 438/154, 188, 197, 199, 948; 257/E21.027, 257/E21.035, E21.036, E21.038

See application file for complete search history.

(56) References Cited

U.S. PATENT DOCUMENTS

2003/0194838 A1* 10/2003 Shih ........................... 438/151

(Continued)

FOREIGN PATENT DOCUMENTS

CN 1790164 6/2006

(Continued)

OTHER PUBLICATIONS

Korean Notice of Allowability corresponding to Korean Patent Application No.2006-0077511, issued on Nov. 12, 2007.

(Continued)

*Primary Examiner*—Ha Tran T Nguyen
*Assistant Examiner*—Daniel Whalen
(74) *Attorney, Agent, or Firm*—Robert E. Bushnell, Esq.

(57) ABSTRACT

A method of fabricating a Complementary Metal-Oxide Semiconductor (CMOS) Thin Film Transistor (TFT) using a reduced number of masks includes: forming a buffer layer on the entire surface of a substrate; forming polysilicon and photoresist layers on the entire surface of the substrate having the buffer layer; exposing and developing the photoresist layer to form a first photoresist pattern having a first thickness in a region where a semiconductor layer of a first TFT is to be formed, a second thickness in a region where a channel and a Lightly Doped Drain (LDD) region of a second TFT are to be formed, and a third thickness in a region where source and drain regions of the second TFT are to be formed; etching the polysilicon layer using the first photoresist pattern as a mask to pattern the semiconductor layers of the first and second TFTs; performing a first ashing process on the first photoresist pattern to form a second photoresist pattern where the region having the third thickness has been removed from the first photoresist pattern; implanting a first impurity into the source and drain regions of the second TFT using the second photoresist pattern as a mask; performing a second ashing process on the second photoresist pattern to form a third photoresist pattern where the region having the second thickness has been removed from the first photoresist pattern; and implanting a second impurity into the second TFT using the third photoresist pattern as a mask to perform channel doping on the second TFT.

22 Claims, 21 Drawing Sheets

U.S. PATENT DOCUMENTS

2006/0006469 A1* 1/2006 Hwang .................. 257/351
2006/0008955 A1* 1/2006 Sera et al. .................. 438/163

FOREIGN PATENT DOCUMENTS

| | | |
|---|---|---|
| JP | 09-082897 | 3/1997 |
| JP | 2004-14622 | 1/2004 |
| JP | 2004-53957 | 2/2004 |
| JP | 2005-91855 | 4/2005 |
| KR | 10-0372579 | 1/2002 |
| KR | 2003-0050273 | 6/2003 |
| KR | 2003-0092873 | 12/2003 |
| KR | 2003-0096674 | 12/2003 |
| KR | 2004-0058699 | 7/2004 |
| KR | 2004-0106794 | 12/2004 |
| KR | 10-2005-0003249 | 1/2005 |
| KR | 2005-0121601 | 12/2005 |
| KR | 2006-0001754 | 1/2006 |
| KR | 2006-0134471 | 12/2008 |
| KR | 2006-0134734 | 12/2008 |

OTHER PUBLICATIONS

Transmitter letter and Chinese Registration Gazette issued on Jul. 29, 2009, in the corresponding Chinese Patent Application No. 200710141862.6 by Chinese Patent Office.

\* cited by examiner

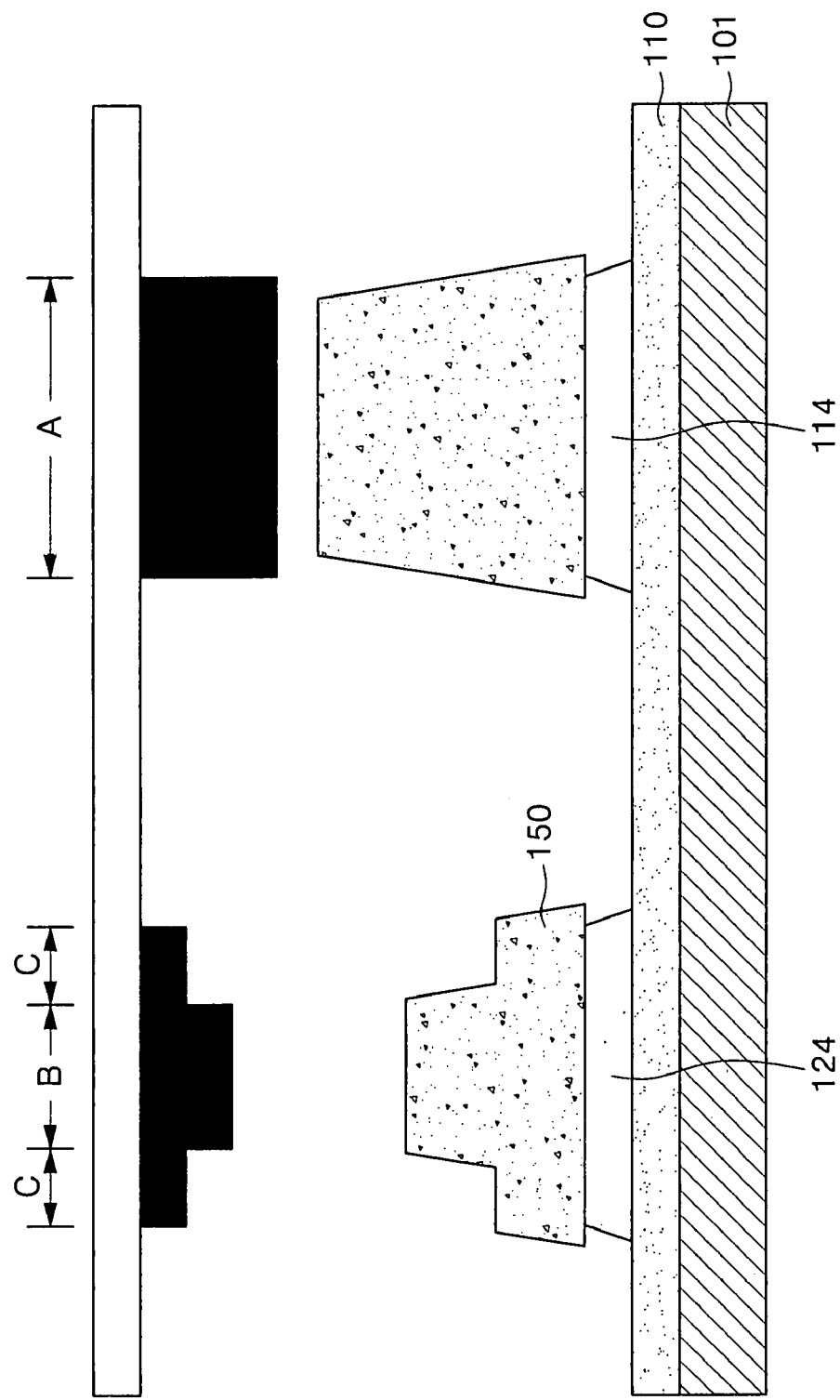

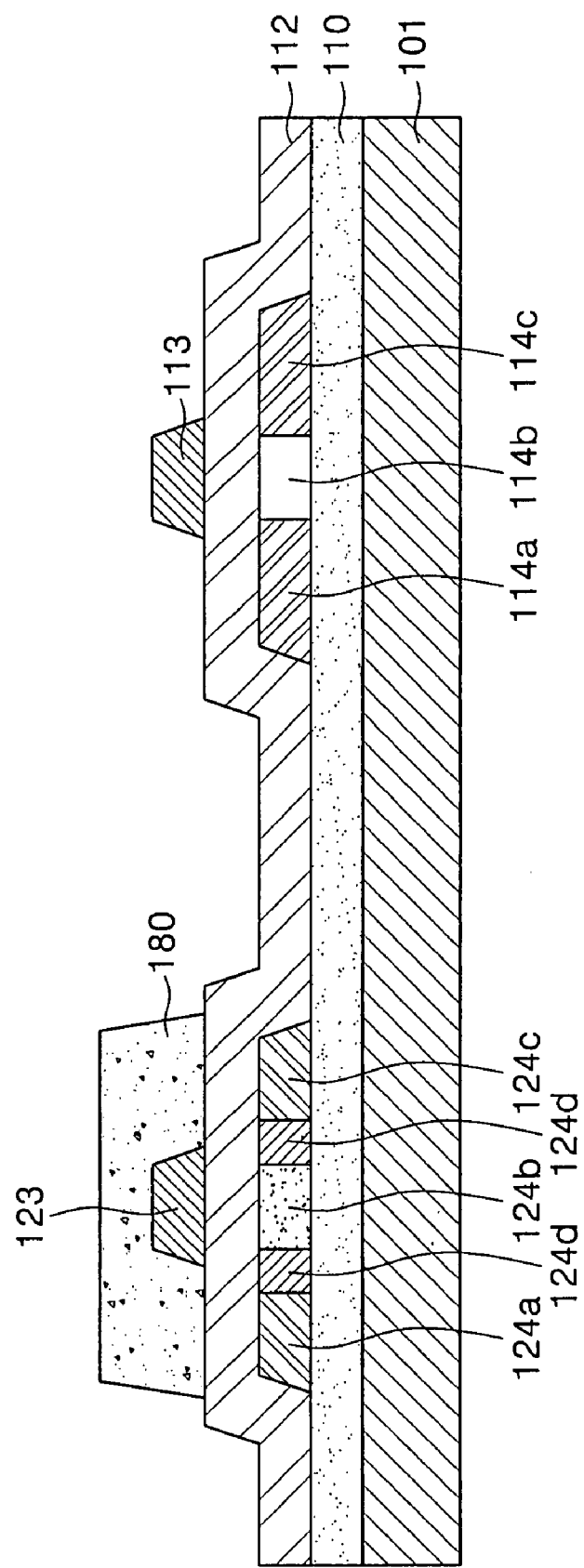

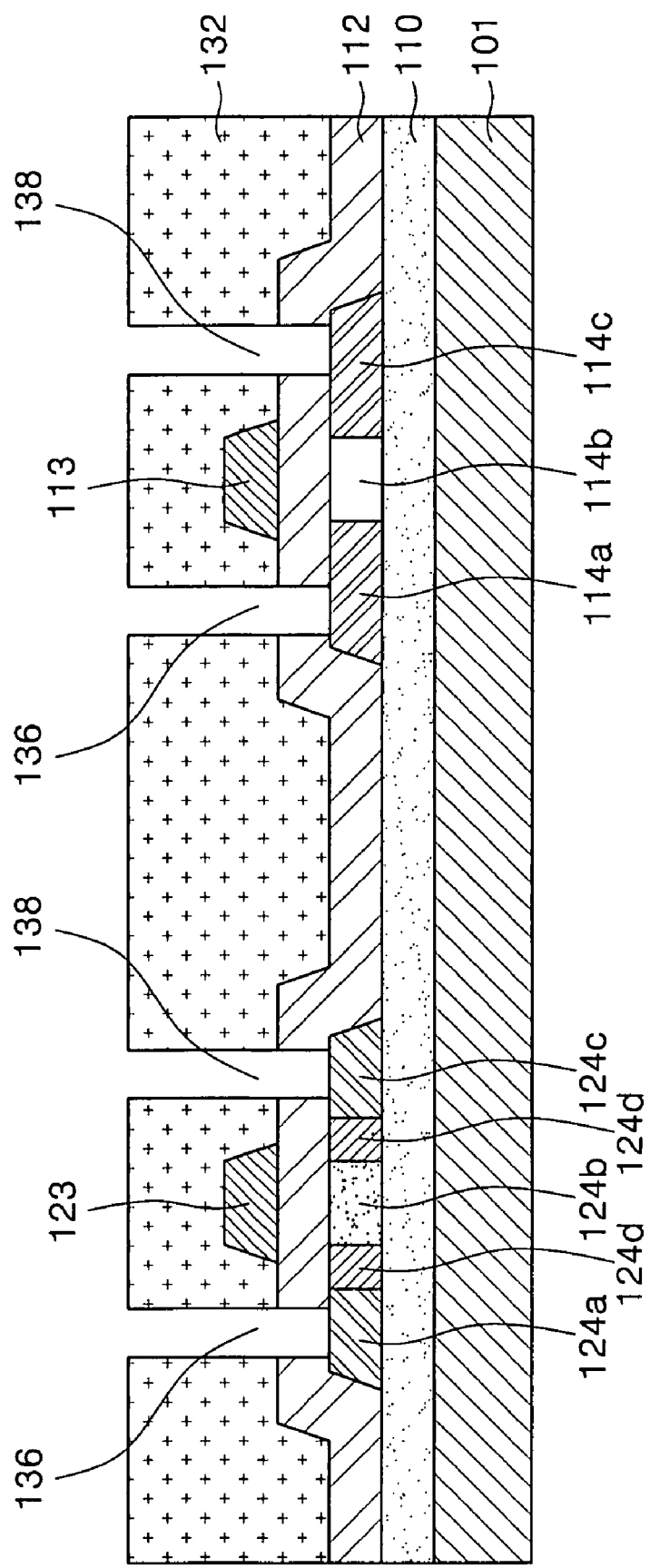

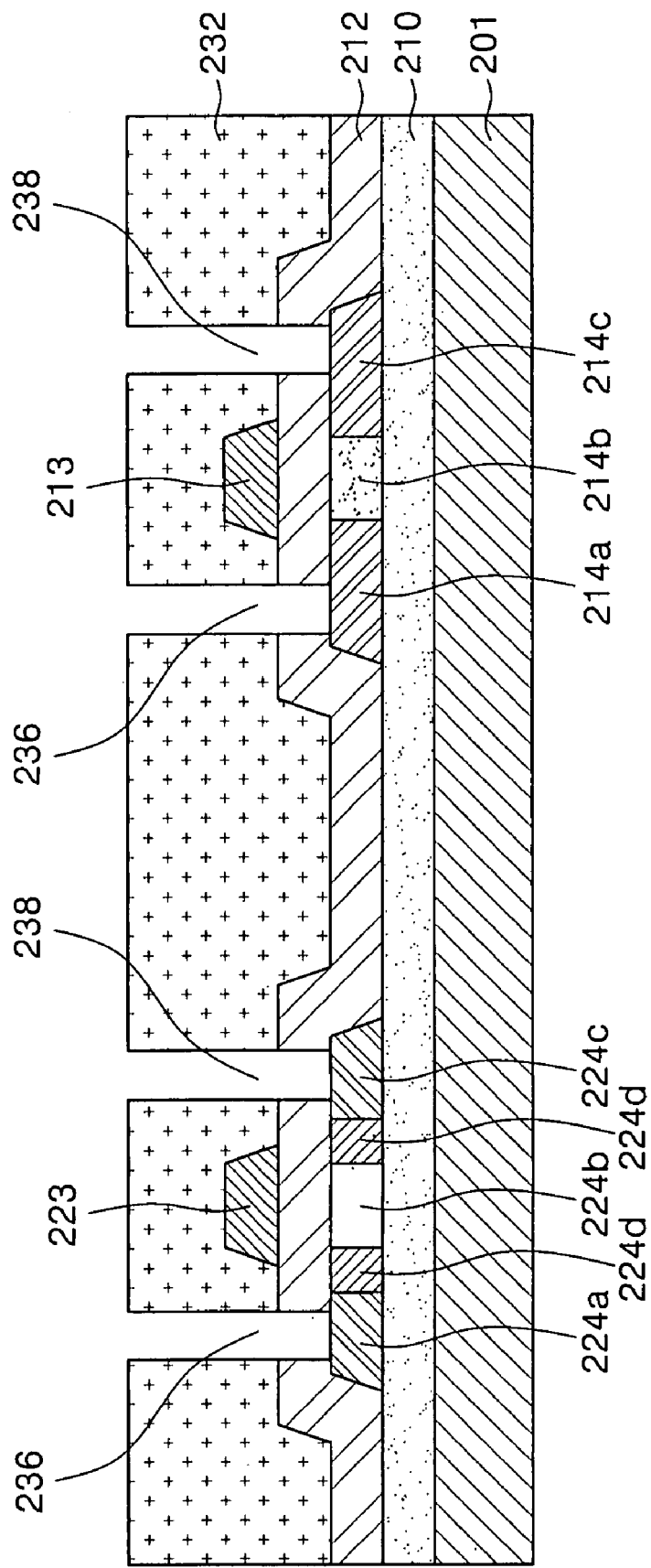

US 7,696,033 B2

METHOD OF FABRICATING COMPLEMENTARY METAL-OXIDE SEMICONDUCTOR (CMOS) THIN FILM TRANSISTOR (TFT)

CLAIM OF PRIORITY

This application makes reference to, incorporates the same herein, and claims all benefits accruing under 35 U.S.C. §119 from an application for METHOD OF FABRICATING CMOS THIN FILM TRANSISTOR earlier filed in the Korean Intellectual Property Office on 17 Aug. 2006 and there duly assigned Serial No. 2006-77511.

BACKGROUND OF THE INVENTION

1. Field of the Invention

The present invention relates to a method of fabricating a Complementary Metal-Oxide Semiconductor (CMOS) Thin Film Transistor (TFT), and more particularly, the present invention relates to a method of fabricating a CMOS TFT using a reduced number of masks.

2. Description of the Related Art

A Complementary Metal-Oxide Semiconductor (CMOS) Thin Film Transistor (TFT) includes both a P-channel Metal-Oxide Semiconductor (PMOS) Thin Film Transistor (TFT) and an N-channel Metal-Oxide Semiconductor (NMOS) Thin Film Transistor (TFT). Therefore, the CMOS TFT is capable of implementing various circuits and systems that are difficult to be implemented using only PMOS TFTs or NMOS TFTs.

Since the CMOS TFT has a PMOS TFT together with an NMOS TFT, it is necessary for the PMOS TFT to have different channel characteristics than the NMOS TFT, i.e., a threshold voltage of the PMOS TFT has to be different from that of the NMOS TFT.

Therefore, in one method of fabricating a CMOS TFT, a predetermined dosage of impurities are implanted into a semiconductor layer of a PMOS TFT or an NMOS TFT to thereby perform channel doping on the PMOS TFT or the NMOS TFT. As a result, a threshold voltage of the PMOS TFT (or the NMOS TFT) is different from that of the NMOS TFT (or the PMOS TFT).

A method of fabricating a CMOS TFT, in which channel doping is performed only on a semiconductor layer of a PMOS TFT is described below with reference to FIGS. 1A to 1G.

Referring to FIG. 1A, in the method of fabricating a CMOS TFT, a buffer layer 10 and a polysilicon layer are formed on the entire surface of a substrate 1, and the polysilicon layer is patterned using a first mask process to thereby form a semiconductor layer 14 of a PMOS TFT and a semiconductor layer 24 of an NMOS TFT. Then, a gate insulating layer 12 is formed on the entire surface of the substrate 1 where the semiconductor layer 14 of the PMOS TFT and the semiconductor layer 24 of the NMOS TFT are formed.

Referring to FIG. 1B, in the method of fabricating a CMOS TFT, a photoresist pattern 50 covering the semiconductor layer 24 of the NMOS TFT is formed on the substrate 1 where the gate insulating layer 12 is formed by a photolithography process employing a second mask process. Then, a small quantity of impurities, such as phosphorus (P), boron (B), etc. are implanted into the semiconductor layer 14 of the PMOS TFT to form a channel-doped semiconductor layer 14b.

Referring to FIG. 1C, in the method of fabricating a CMOS TFT, a photoresist pattern 60 covering the entire region of the channel-doped semiconductor layer 14b of the PMOS TFT and covering the entire region of the NMOS TFT except for regions where a source region and a drain region are formed is formed on the substrate 1 where the channel-doped semiconductor layer 14b of the PMOS TFT is formed by a photolithography process employing a third mask. Then, N+ type impurities, such as phosphorus (P), arsenic (As), antimony (Sb), bismuth (Bi), etc. are implanted into the regions where the exposed source and drain regions of the NMOS TFT will be formed using the photoresist pattern 60 as a mask to thereby form source and drain regions 24a and 24c of the NMOS TFT. Afterwards, the photoresist pattern 60 is removed by a stripping process.

Referring to FIG. 1D, in the method of fabricating a CMOS TFT, a gate electrode 13 of the PMOS TFT overlapping a region where the channel-doped channel of the PMOS TFT will be formed, and a gate electrode 23 of the NMOS TFT overlapping a region where a channel of the NMOS TFT will be formed are formed on the substrate 1 where the source and drain regions 24a and 24c of the NMOS TFT are formed using a fourth mask process. The gate electrode 23 of the NMOS TFT is formed to have a narrower width than that of the photoresist pattern 60 for forming the source and drain regions 24a and 24c of the NMOS TFT. Impurities are then implanted into the exposed semiconductor layer 14b of the PMOS TFT and the exposed semiconductor layer 24 of the NMOS TFT using the gate electrode 13 of the PMOS TFT and the gate electrode 23 of the NMOS TFT as masks to thereby define the channel-doped channel 14b of the PMOS TFT overlapping the gate electrode 13 of the PMOS TFT and the channel 24b of the NMOS TFT overlapping the gate electrode 23 of the NMOS TFT. Afterwards, Lightly Doped Drain (LDD) regions 24d of the NMOS TFT are formed between the channel 24b of the NMOS TFT and the source and drain regions 24a and 24c of the NMOS TFT.

Referring to FIG. 1E, in the method of fabricating a CMOS TFT, a photoresist pattern 70 covering the entire regions of the semiconductor layers 24a to 24d of the NMOS TFT and covering the entire region of the PMOS TFT except for regions where a source region and a drain region will be formed is formed on the substrate 1 where the LDD regions 24b of the NMOS TFT are formed using a photolithography process employing a fifth mask. Then, P+ type impurities, such as boron (B), aluminum (Al), gallium (Ga), indium (In), etc. are implanted into the regions where the exposed source and drain regions of the PMOS TFT will be formed using the photoresist pattern 70 as a mask to thereby form the source and drain regions 14a and 14c of the PMOS TFT. Afterwards, the photoresist pattern 70 is removed by the stripping process.

Referring to FIG. 1F, an interlayer insulating layer 32 is formed on the entire surface of the substrate 1 where the source and drain regions 14a and 14c of the PMOS TFT are formed. Then, a source contact hole 36 and a drain contact hole 38 exposing the source and drain regions 14a and 14c of the PMOS TFT and the source and drain regions 24a and 24c of the NMOS TFT are formed through the gate insulating layer 12 and the interlayer insulating layer 32 using a sixth mask process.

Next, as illustrated in FIG. 1G, source and drain electrodes 15 and 16 of the PMOS TFT connected to the source and drain regions 14a and 14c of the PMOS TFT through the source and drain contact holes 36 and 38, and source and drain electrodes 25 and 26 of the NMOS TFT connected to the source and drain regions 24a and 24c of the NMOS TFT through the source and drain contact holes 36 and 38 are formed using a seventh mask process.

As described above, the method of fabricating a CMOS TFT, in which a predetermined dosage of impurities are implanted only into the semiconductor layer of the PMOS TFT requires seven mask processes. This is applied to the method of fabricating a CMOS TFT, in which a predetermined dosage of impurities are implanted only into the semiconductor layer of the NMOS TFT as well. The mask process includes a plurality of processes such as a photoresist photo process, exposure and development processes, an etching process, a photoresist stripping process, etc. Therefore, in the method of fabricating a CMOS TFT that requires the seven mask processes, manufacturing processes are complicated, and the CMOS TFT manufacturing costs are increased.

SUMMARY OF THE INVENTION

The present invention provides a method of fabricating a Complementary Metal-Oxide Semiconductor (CMOS) TFT using a reduced number of masks.

In an exemplary embodiment of the present invention, a method of fabricating a CMOS TFT includes: forming a buffer layer on an entire surface of a substrate; forming a polysilicon layer and a photoresist layer on the entire surface of the substrate having the buffer layer; exposing and developing the photoresist layer to form a first photoresist pattern having a first thickness in a region where a semiconductor layer of a first TFT is to be formed, a second thickness in a region where a channel and a Lightly Doped Drain (LDD) region of a second TFT is to be formed, and a third thickness in a region where source and drain regions of the second TFT is to be formed; etching the polysilicon layer using the first photoresist pattern as a mask to pattern the semiconductor layer of the first TFT and the semiconductor layer of the second TFT; performing a first ashing process on the first photoresist pattern to form a second photoresist pattern where the region having the third thickness has been removed from the first photoresist pattern; implanting a first impurity into the source and drain regions of the second TFT using the second photoresist pattern as a mask; performing a second ashing process on the second photoresist pattern to form a third photoresist pattern where the region having the second thickness has been removed from the first photoresist pattern; and implanting a second impurity into the second TFT using the third photoresist pattern as a mask to perform channel doping on the second TFT.

In another exemplary embodiment of the present invention, a method of fabricating a CMOS TFT includes: forming a buffer layer on an entire surface of a substrate; forming a polysilicon layer and a photoresist layer on the entire surface of the substrate having the buffer layer; exposing and developing the photoresist layer to form a first photoresist pattern having a first thickness in a region where a channel and a Lightly Doped Drain (LDD) region of a second TFT is to be formed, a second thickness in a region where a semiconductor layer of a first TFT is to be formed, and a third thickness in a region where source and drain regions of the second TFT is to be formed; etching the polysilicon layer using the first photoresist pattern as a mask to pattern the semiconductor layer of the first TFT and the semiconductor layer of the second TFT; performing a first ashing process on the first photoresist pattern to form a second photoresist pattern where the region having the third thickness has been removed from the first photoresist pattern; implanting a first impurity into the source and drain regions of the second TFT using the second photoresist pattern as a mask; performing a second ashing process on the second photoresist pattern to form a third photoresist pattern where the region having the second thickness has been removed from the first photoresist pattern; and implanting a second impurity into the first TFT using the third photoresist pattern as a mask to perform channel doping on the first TFT.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein:

FIGS. 2A to 2G are cross-sectional views of a method of fabricating a CMOS TFT according to an exemplary embodiment of the present invention; and FIGS. 3A to 3G are cross-sectional views of a method of fabricating a CMOS TFT according to another exemplary embodiment of the present invention.

DETAILED DESCRIPTION OF THE INVENTION

Figure 1A:
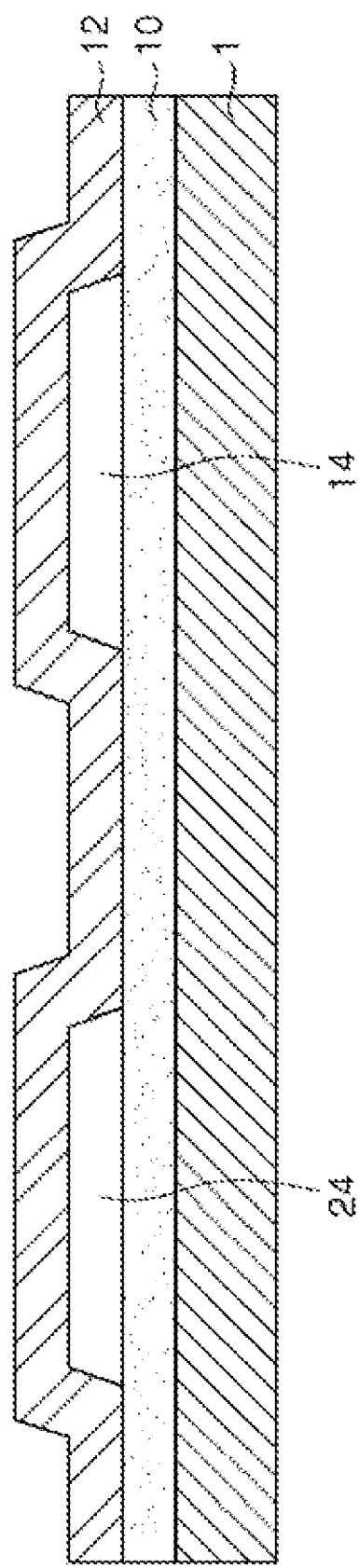
FIGS. 1A to 1G are cross-sectional views of a method of fabricating a Complementary Metal-Oxide Semiconductor (CMOS) TFT.
Figure 1B:
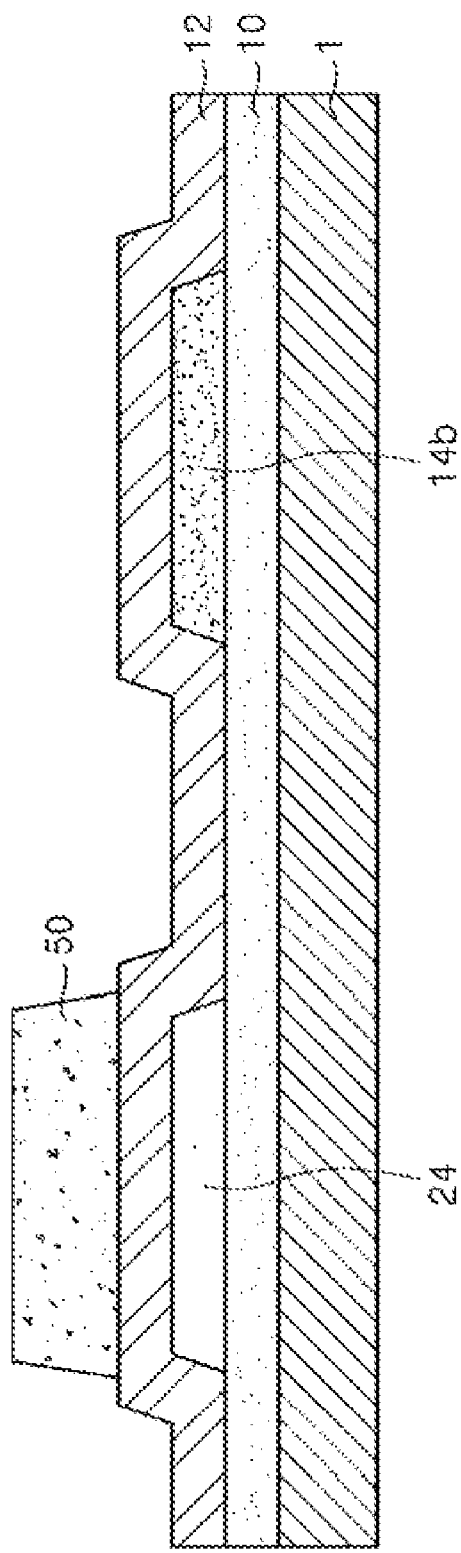
Figure 1C:
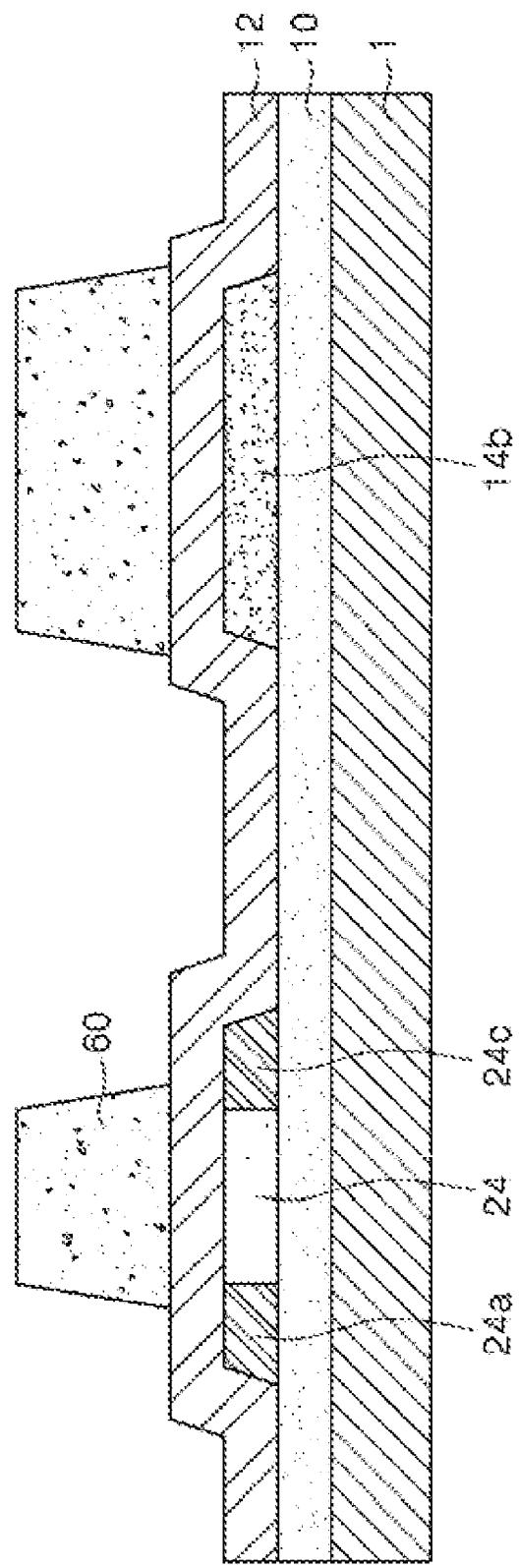
Figure 1D:
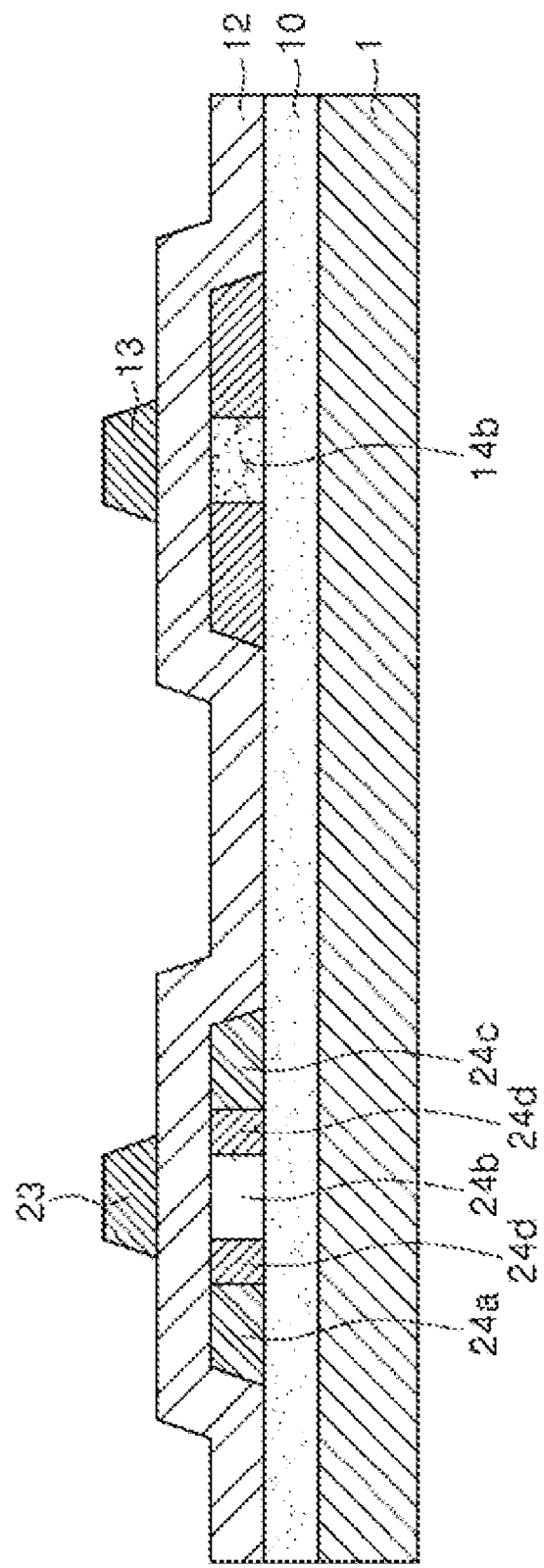
Figure 1E:
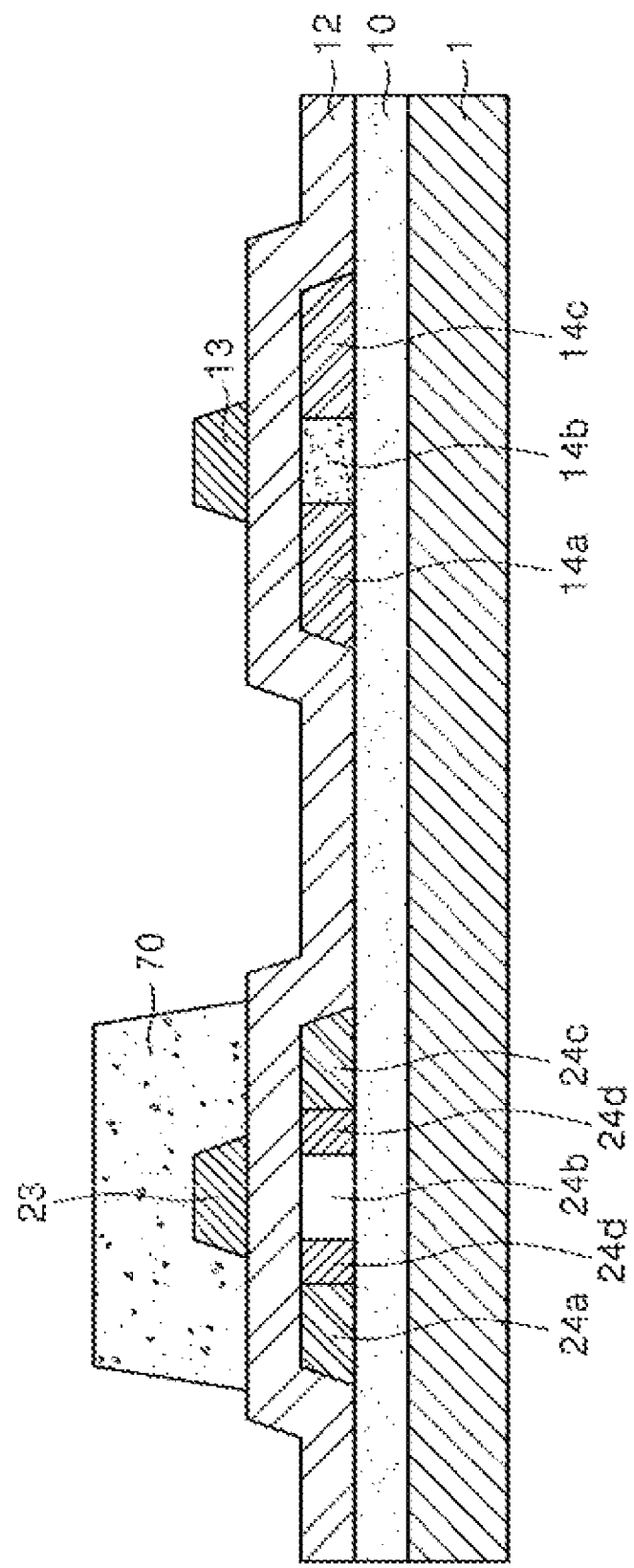
Figure 1F:
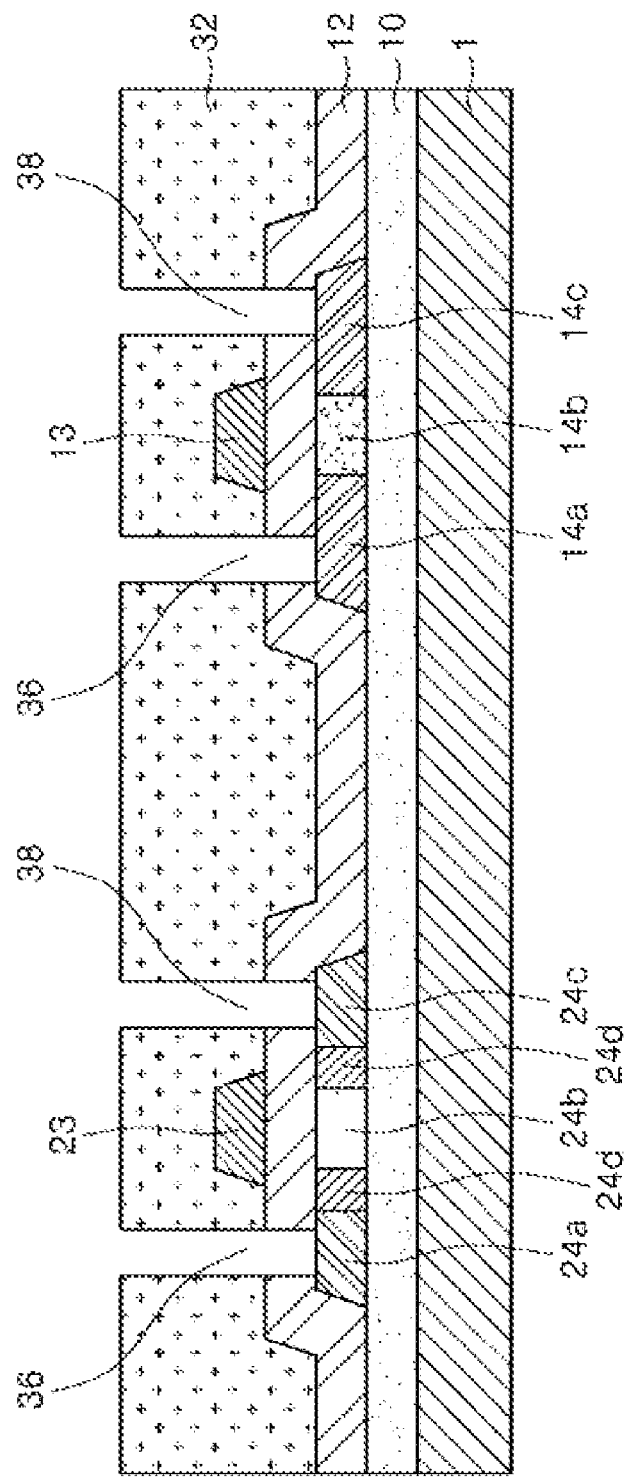
Figure 1G:
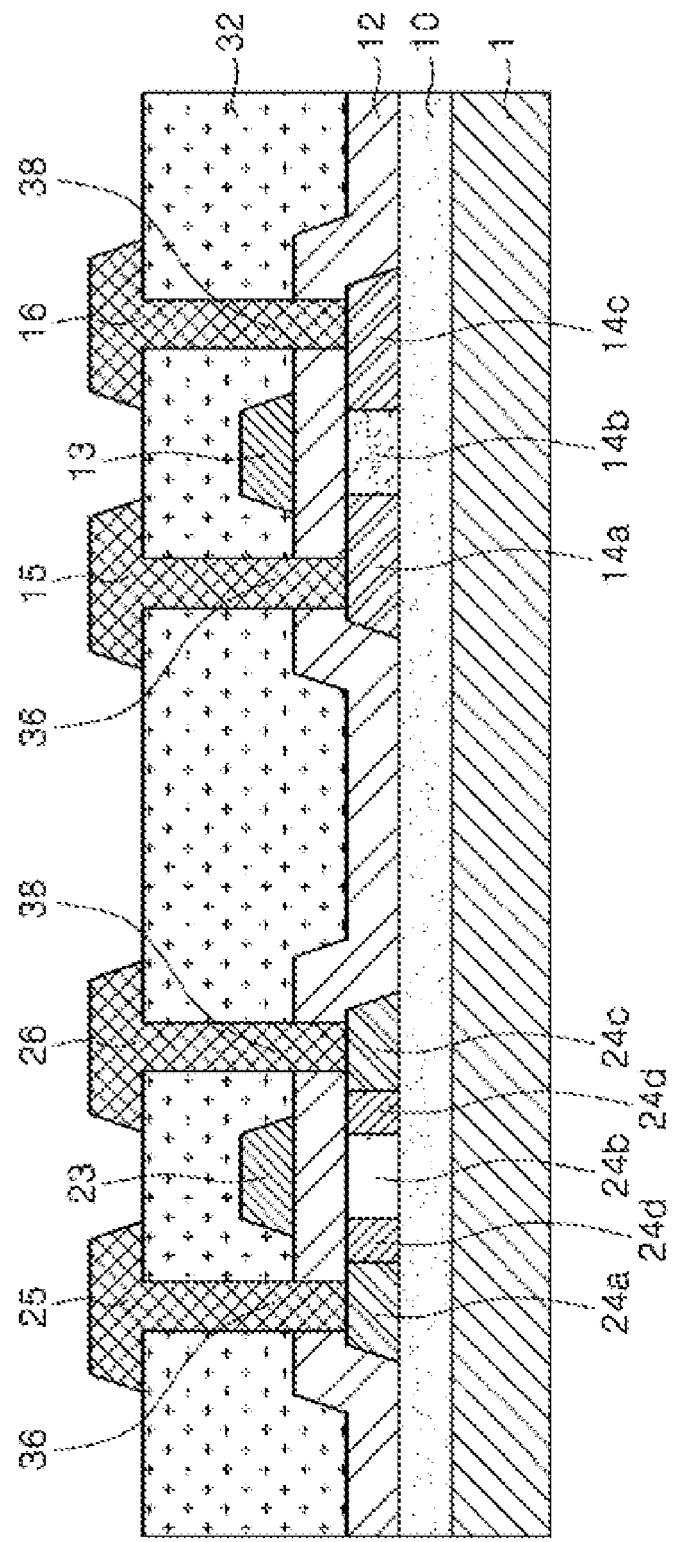

The present invention is described more fully hereinafter with reference to the accompanying drawings, in which exemplary embodiments of the present invention are shown. In the drawings, the thicknesses of layers and regions are exaggerated for clarity. The same reference numerals are used to denote the same elements.

Figure 2B:
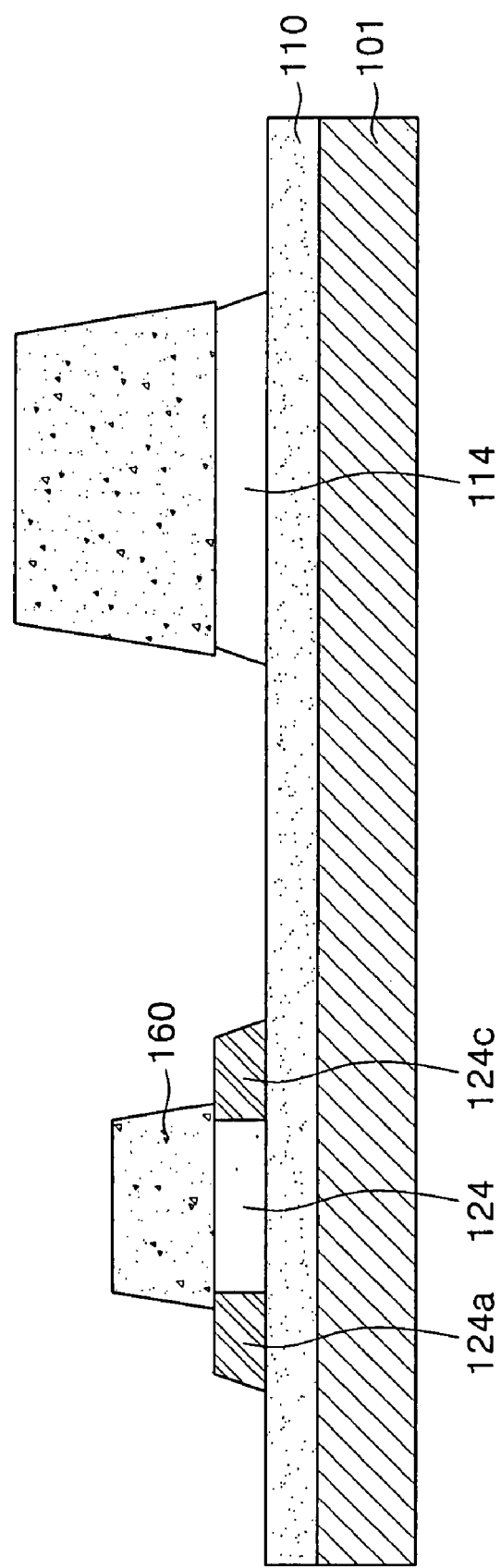
Figure 2C:
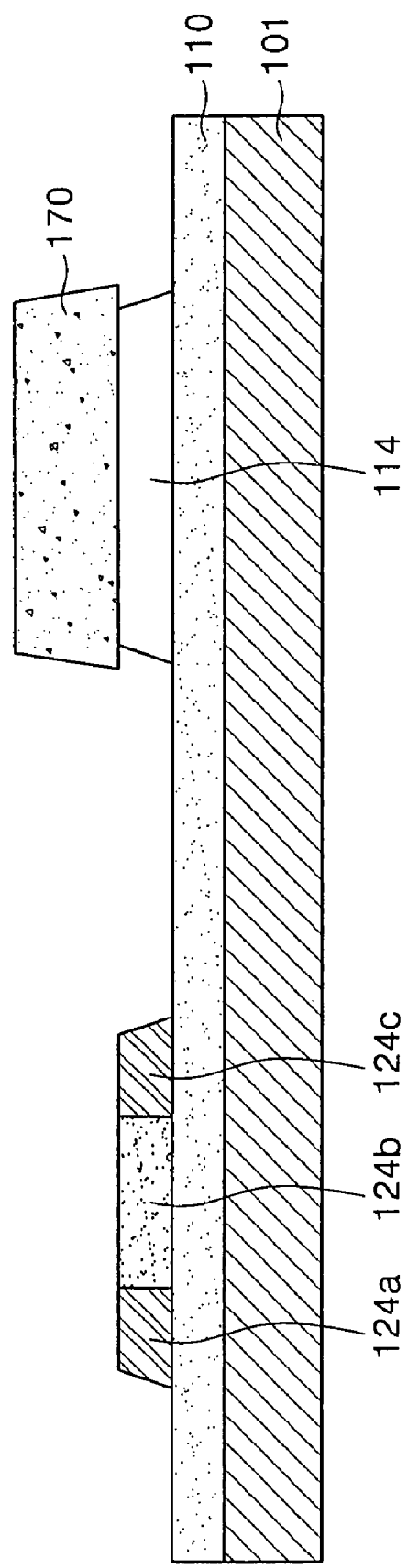
Figure 2D:
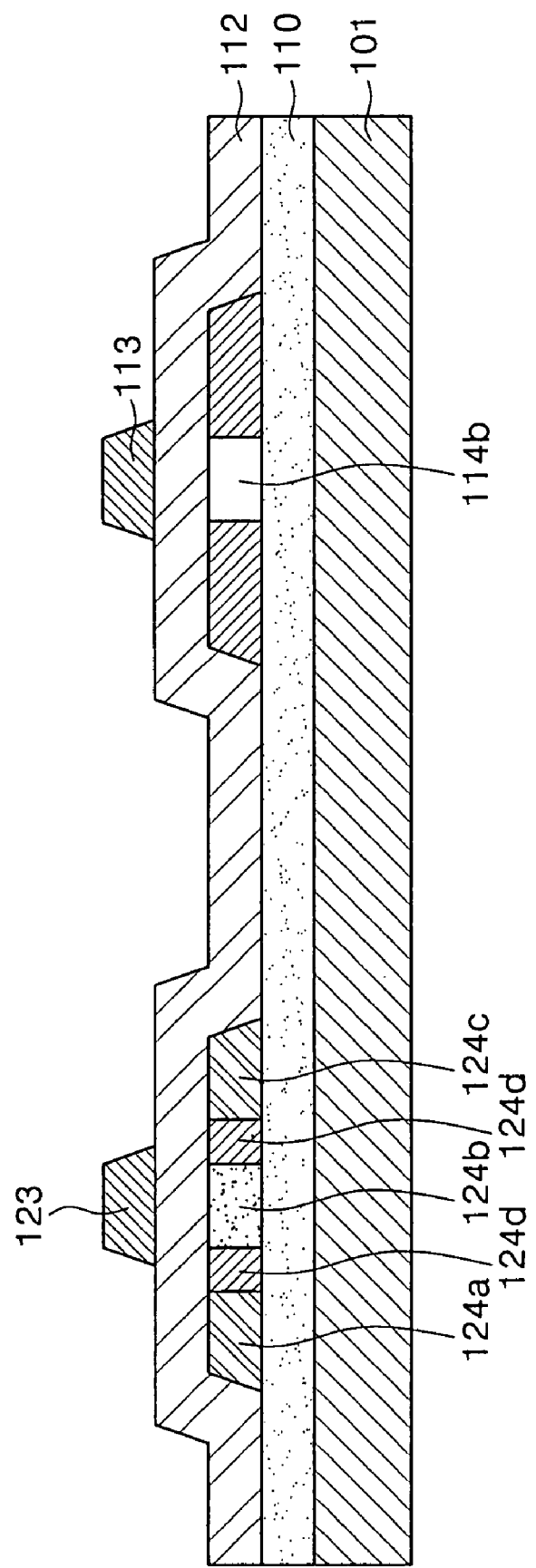
Figure 2G:
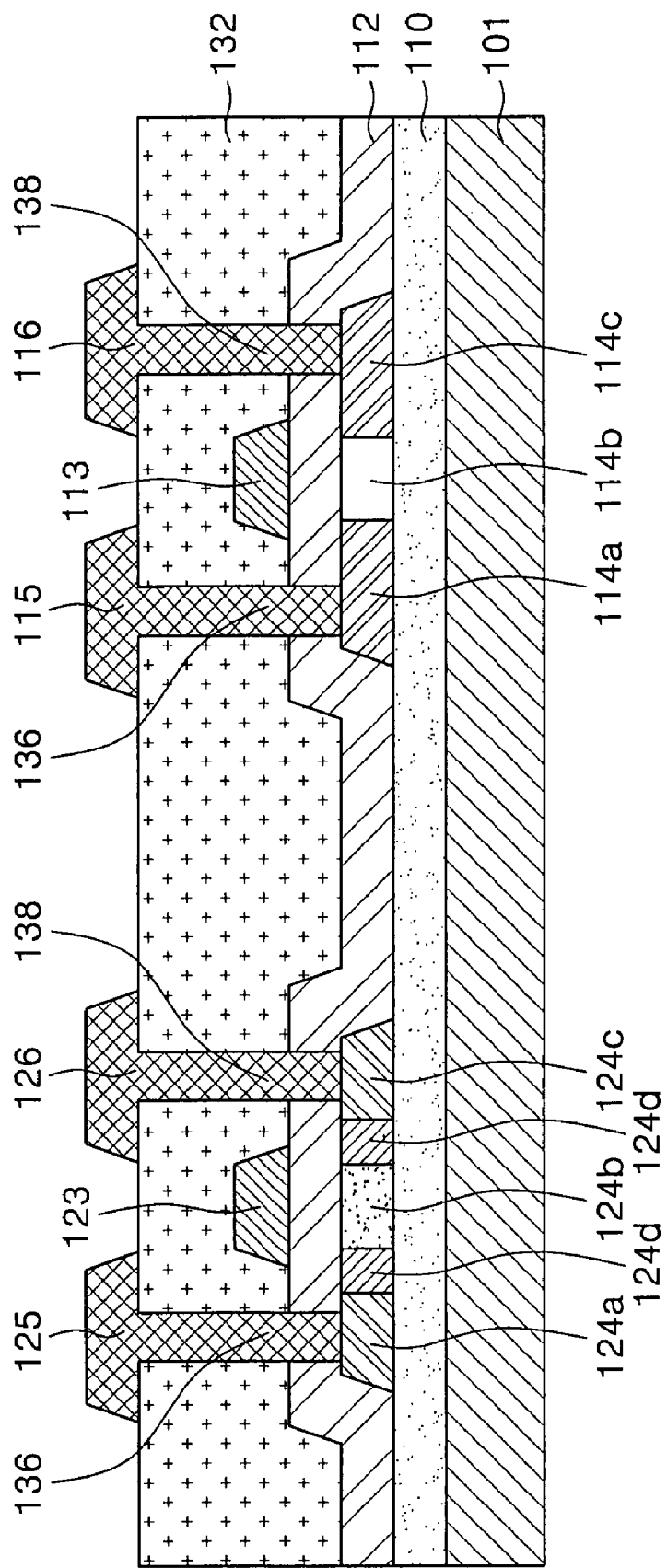

FIGS. 2A and 2G are cross-sectional views of a method of fabricating a Complementary Metal-Oxide Semiconductor (CMOS) TFT according to an exemplary embodiment of the present invention.

Referring to FIG. 2A, in the method of fabricating a CMOS TFT according to an exemplary embodiment of the present invention, a buffer layer 110 is formed on the entire surface of a substrate 101, and a polysilicon layer and a photoresist layer are formed on the buffer layer 110.

Sequentially, a first mask having a first black matrix, a second black matrix, and a third black matrix is arranged on the entire surface of the substrate 101 having the polysilicon layer and the photoresist layer.

The first black matrix is formed to a first thickness in a region A corresponding to a region where a semiconductor layer of a P-channel Metal-Oxide Semiconductor (PMOS) TFT will be formed, the second black matrix is formed to a thickness of ⅔ of the first thickness in a region B corresponding to a region where a channel and a Lightly Doped Drain (LDD) region of an N-channel Metal-Oxide Semiconductor (NMOS) TFT will be formed, and the third black matrix is formed to a thickness of ⅓ of the first thickness in a region C corresponding to a region where source and drain regions of the NMOS TFT will be formed. Then, the photoresist layer coated on the entire surface of the substrate 101 is exposed and developed to thereby form a first photoresist pattern 150. The first photoresist pattern 150 is formed to a first thickness in the region where the semiconductor layer of the PMOS TFT will be formed, formed to a thickness of ⅔ of the first thickness in the region where the channel and the LDD region of the NMOS TFT will be formed, and formed to a thickness of ⅓ of the first thickness in the region where the source and drain regions of the NMOS TFT will be formed. Sequentially, the polysilicon layer is etched using the first photoresist pattern 150 as a mask to thereby form a semiconductor layer 114 of the PMOS TFT and a semiconductor layer 124 of the NMOS TFT.

The first mask may have the third black matrix having light-shielding slits formed to have a first interval, the second black matrix having light-shielding slits formed to have an interval of ⅔ of the first interval, and the first black matrix having light-shielding slits formed to have an interval of ⅓ of the first interval.

Referring to FIG. 2B, in the method of fabricating a CMOS TFT of the present invention, a first ashing process is performed on the first photoresist pattern 150 of FIG. 2A. As a result, the region formed to a thickness of ⅓ of the first thickness in the region where the source and drain regions of the NMOS TFT will be formed is removed from the first photoresist pattern 150. Then, a second photoresist pattern 160 formed to a thickness of ⅔ of the first thickness in the region where the semiconductor layer of the PMOS TFT will be formed and formed to a thickness of ⅓ of the first thickness in the region where the channel and the LLD region of the NMOS TFT will be formed is formed through the first ashing process. Sequentially, N+ impurities, such as phosphorus (P), arsenic (As), antimony (Sb), bismuth (Bi), etc. are implanted into the region where the source and drain regions of the NMOS TFT will be formed in the exposed semiconductor layer 124 of the NMOS TFT using the second photoresist pattern 160 as a mask to thereby form source and drain regions 124a and 124c of the NMOS TFT, so that the source and drain regions of the NMOS TFT have the impurity concentration of $5E^{20}$ atoms/cm$^3$ to $2E^{21}$ atoms/cm$^3$, preferably the impurity concentration of $1E^{21}$ atoms/cm$^3$.

Referring to FIG. 2C, a second ashing process is performed on the second photoresist pattern 160 of FIG. 2B. As a result, the region formed to a thickness of ⅓ of the first thickness in the region where the channel and the LDD regions of the NMOS TFT will be formed is removed from the second photoresist pattern 160. Then, a third photoresist pattern 170 that is formed to a thickness of ⅓ of the first thickness in the region where the semiconductor layer of the PMOS TFT will be formed is formed through the second ashing process. Sequentially,—impurities, such as phosphorus (P) boron hydride (B), etc. are implanted into the region where the exposed channel and LDD regions of the NMOS TFT using the third photoresist pattern 170 as a mask to thereby perform channel doping on the channel and the LDD regions 124b of the NMOS TFT, so that the exposed channel and LDD regions have the very low impurity concentration of $5E^{16}$ atoms/cm$^3$ to $3E^{17}$ atoms/cm$^3$, preferably the impurity concentration of $1E^{17}$ atoms/cm$^3$. The channel-doped channel and LDD regions 124b of the NMOS TFT do not have a conductivity type due to the impurities implanted at a very low dosage. In addition, a stripping process is employed to remove the third photoresist pattern 170. Next, a gate insulating layer 112 is formed on the entire surface of the substrate 101 where the semiconductor layer 114 of the PMOS TFT and the semiconductor layers 124a to 124c of the NMOS TFT are formed.

Referring to FIG. 2D, a gate electrode 113 of the PMOS TFT overlapping a region where a channel of the PMOS TFT will be formed, and a gate electrode 123 of the NMOS TFT overlapping a region where a channel of the NMOS TFT will be formed are formed on the substrate 101 where the gate insulating layer 112 is formed using a second mask process. The gate electrode 123 of the NMOS TFT is formed to have a narrower width than the channel-doped channel and LDD regions 124b of the NMOS TFT. Then, N− impurities, such as phosphorus (P), arsenic (As), antimony (Sb), bismuth (Bi), etc., which is lower than the N+ impurities, are implanted into the exposed semiconductor layer 114 of the PMOS TFT and the exposed channel and the LDD regions 124c of the NMOS TFT using the gate electrode 113 of the PMOS TFT and the gate electrode 123 of the NMOS TFT as masks to thereby define the channel 114b of the PMOS TFT overlapping the gate electrode 113 of the PMOS TFT and the channel-doped channel 124b of the NMOS TFT overlapping the gate electrode 123 of the NMOS TFT, so that the exposed semiconductor layer of the PMOS TFT and the exposed channel and the LDD regions have the impurity concentration of $5E^{18}$ atoms/cm$^3$ to $2E^{19}$ atoms/cm$^3$, preferably the impurity concentration of $1E^{19}$ atoms/cm$^3$. Afterwards, LDD regions 124d of the NMOS TFT are formed between the channel 124b of the NMOS TFT and the source and drain regions 124a and 124c of the NMOS TFT.

Referring to FIG. 2E, a photoresist pattern 180 covering the entire regions of the semiconductor layers 124a to 124d of the NMOS TFT and a region except for the region where the source and drain regions of the PMOS TFT will be formed is formed on the substrate 101 where the LDD regions 124b of the NMOS TFT are formed by a photolithography process employing a third mask. Sequentially, P+ impurities, such as boron (B), aluminum (Al), gallium (Ga), indium (In), etc. are implanted into the region where the source and drain regions of the PMOS TFT will be formed in the exposed semiconductor layer 114 of the PMOS TFT using the photoresist pattern 180 as a mask to thereby form the source and drain regions 114a and 114c of the PMOS TFT, so that the source and drain regions of the PMOS TFT have the impurity concentration of $5E^{20}$ atoms/cm$^3$ to $2E^{21}$ atoms/cm$^3$, preferably the impurity concentration of $1E^{21}$ atoms/cm$^3$. Then, a stripping process is employed to remove the photoresist pattern 180.

Referring to FIG. 2F, after an interlayer insulating layer 132 is formed on the entire surface of the substrate 101 where the source and drain regions 114a and 114c of the PMOS TFT are formed, source contact holes 136 and drain contact holes 138 exposing the source and drain regions 114a and 114c of the PMOS TFT and the source and drain regions 124a and 124c of the NMOS TFT are formed through the gate insulating later 112 and the interlayer insulating layer 132 using a fourth mask process. Then, as illustrated in FIG. 2G, source and drain electrodes 115 and 116 of the PMOS TFT connected to the source and drain regions 114a and 114c of the PMOS TFT, and source and drain electrodes 125 and 126 of the NMOS TFT connected to the source and drain regions 124a and 124c of the NMOS TFT are formed through the source and drain contact holes 136 and 138.

As described above, in the method of fabricating a CMOS TFT in accordance with an embodiment of the present invention, the first mask having the first black matrix formed to the first thickness, the second black matrix formed to a thickness of ⅔ of the first thickness, and the third black matrix formed to a thickness of ⅓ of the first thickness is employed to form the semiconductor layer 114 of the PMOS TFT, the channel-doped channel 124b of the NMOS TFT, and the source and drain regions 124a and 124c of the NMOS TFT.

Accordingly, in the method of fabricating a CMOS TFT of the present invention, a CMOS TFT in which channel doping is performed on a semiconductor layer of an NMOS TFT is formed using a five-mask process. Compared with the method of fabricating a CMOS TFT, in which the channel doping is performed on the semiconductor layer of the NMOS TFT, two mask processes are reduced in the method of fabricating a CMOS TFT in accordance with an embodiment of the present invention. As a result, in the method of fabricating a CMOS TFT, in which the channel doping is performed on the semiconductor layer of the NMOS TFT in accordance with an embodiment of the present invention, it is possible to simplify the manufacturing processes and to reduce the CMOS TFT manufacturing costs.

FIGS. 3A to 3F are cross-sectional views of a method of fabricating a CMOS TFT according to another embodiment of the present invention.

Figure 3A:
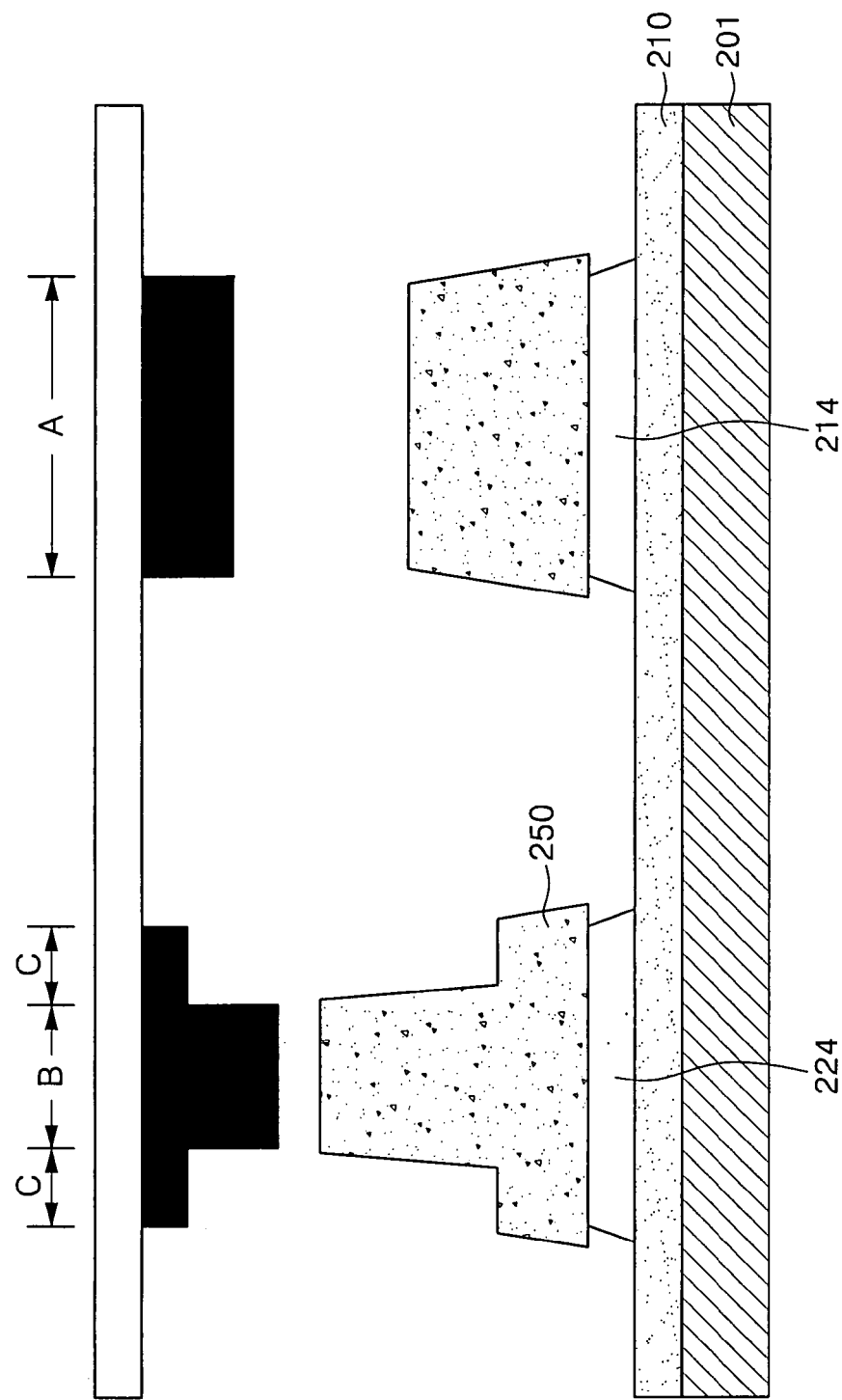

Referring to FIG. 3A, in the method of fabricating a CMOS TFT according to another embodiment of the present invention, a buffer layer 210 is formed on the entire surface of a substrate 201, and a polysilicon layer and a photoresist layer are formed on the entire surface of the buffer layer 210. Sequentially, a first mask is arranged on the entire surface of the substrate 201 having the polysilicon layer and the photoresist layer. The first mask includes: a first black matrix formed to a first thickness in a region B corresponding to a region where a channel and an LDD region of an NMOS TFT will be formed; a second black matrix formed to a thickness of ⅔ of the first thickness in a region A corresponding to a region where a semiconductor layer of a PMOS TFT will be formed; and a third black matrix formed to a thickness of ⅓ of the first thickness in a region C corresponding to a region where source and drain regions of the NMOS TFT will be formed. Then, the photoresist layer coated on the entire surface of the substrate 201 is exposed and developed to thereby form a first photoresist pattern 250 that is formed to a first thickness in the region where the channel and the LDD region of the NMOS TFT will be formed, formed to a thickness of ⅔ of the first thickness in the region where the semiconductor layer of the PMOS TFT will be formed, and formed to a thickness of ⅓ of the first thickness in the region where the source and drain regions of the NMOS TFT will be formed. Sequentially, the polysilicon layer is etched using the first photoresist pattern 250 as a mask to thereby form a semiconductor layer 214 of the PMOS TFT and a semiconductor layer 224 of the NMOS TFT.

The first mask may have the third black matrix having light-shielding slits formed to have a first interval, the second black matrix having light-shielding slits formed to have an interval of ⅔ of the first interval, and the first black matrix having light-shielding slits formed to have an interval of ⅓ of the first interval.

Figure 3B:
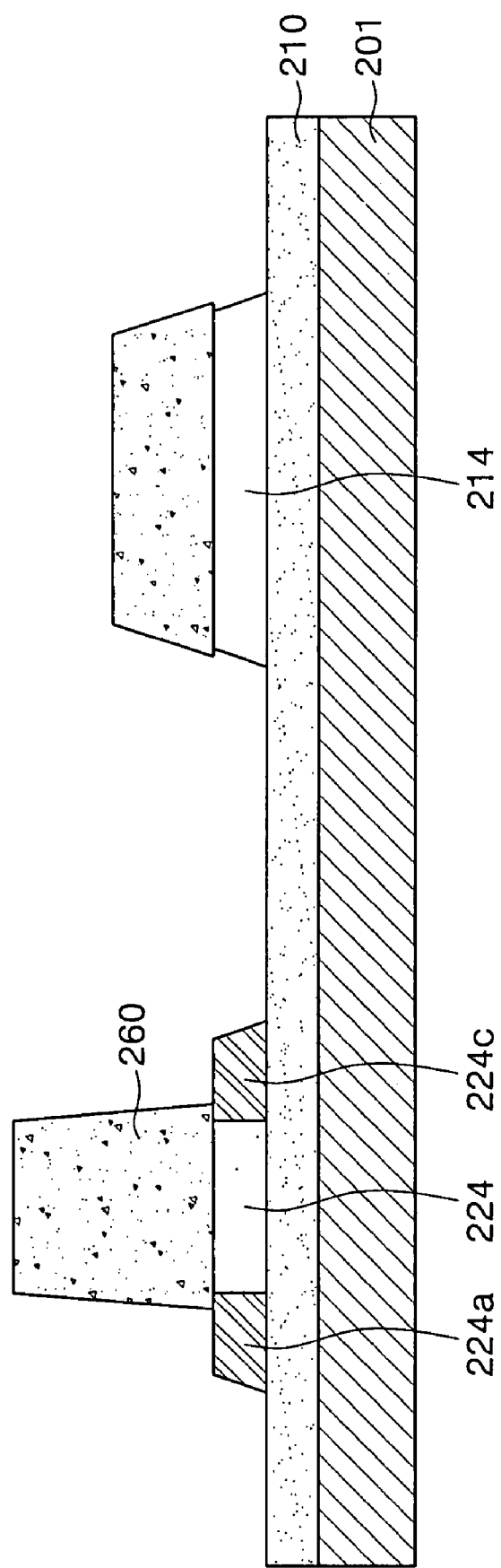

Referring to FIG. 3B, a first ashing process is performed on the first photoresist pattern 250 illustrated in FIG. 3A. As a result, the region formed to a thickness of ⅓ of the first thickness in the region where the source and drain regions of the NMOS TFT will be formed is removed from the first photoresist pattern 250. Then, a second photoresist pattern 260 that is formed to a thickness of ⅔ of the first thickness on the channel and the LLD region of the NMOS TFT, and formed to a thickness of ⅓ of the first thickness in the region where the semiconductor layer of the PMOS TFT will be formed is formed. Sequentially, N+ impurities, such as P, As, Sb, Bi, etc. are implanted into the region where the source and drain regions of the NMOS TFT will be formed in the exposed semiconductor layer 224 of the NMOS TFT using the second photoresist pattern 260 as a mask to thereby form source and drain regions 224a and 224c of the NMOS TFT, so that the source and drain regions of the NMOS TFT have the impurity concentration of $5E^{20}$ atoms/cm$^3$ to $2E^{21}$ atoms/cm$^3$, preferably the impurity concentration of $1E^{21}$ atoms/cm$^3$.

Figure 3C:
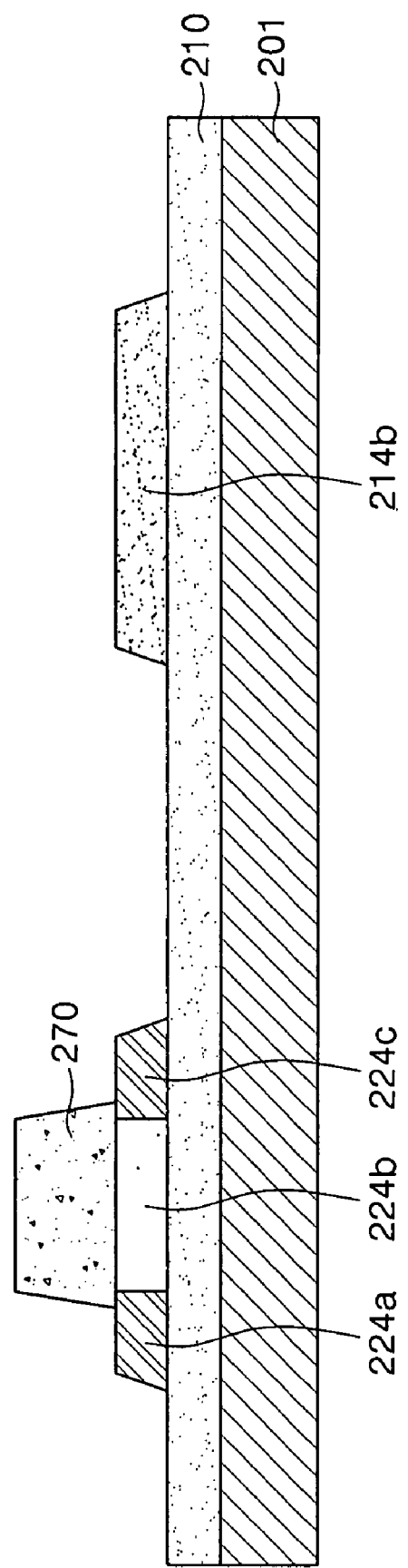

Referring to FIG. 3C, a second ashing process is performed on the second photoresist pattern 260 illustrated in FIG. 3B. As a result, the region formed to a thickness of ⅓ of the first thickness in the region where the semiconductor layer of the PMOS TFT will be formed is removed from the second photoresist pattern 260. Then, a third photoresist pattern 270 that is formed to a thickness of ⅓ of the first thickness in the region where the channel and the LDD region of the NMOS TFT will be formed is formed through the second ashing process. Sequentially, impurities, such as P, B, etc. are implanted into the exposed semiconductor layer of the PMOS TFT using the third photoresist pattern 270 as a mask to thereby perform channel doping on the semiconductor layer 214b of the PMOS TFT, so that the exposed semiconductor layer of the PMOS TFT has the impurity concentration of $5E^{16}$ atoms/cm$^3$ to $3E^{17}$ atoms/cm$^3$, preferably the impurity concentration of $1E^{17}$ atoms/cm$^3$. The channel-doped semiconductor layer 214b of the PMOS TFT does not have a conductivity type due to the impurities implanted at a very low dosage. In addition, a stripping process is employed to remove the third photoresist pattern 270. Next, a gate insulating layer 212 is formed on the entire surface of the substrate 201 where the channel-doped semiconductor layer 214b of the PMOS TFT and the semiconductor layers 224a to 224c of the NMOS TFT are formed.

Figure 3D:
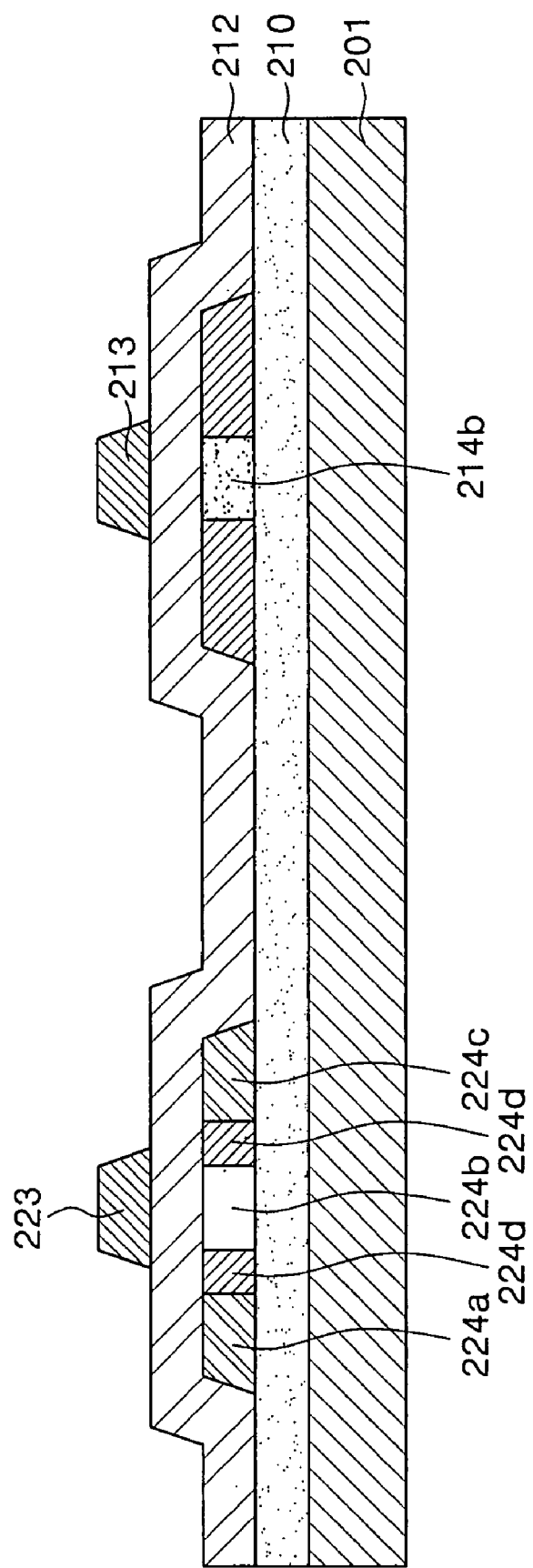

Referring to FIG. 3D, a gate electrode 213 of the PMOS TFT overlapping the region where the channel of the PMOS TFT will be formed, and a gate electrode 223 of the NMOS TFT overlapping the region where the channel of the NMOS TFT will be formed are formed on the substrate 201 where the gate insulating layer 212 is formed using a second mask process. The gate electrode 223 of the NMOS TFT is formed to have a narrower width than the semiconductor layer 224 of the NMOS TFT, into which the N+ impurities are not implanted. Then, N− impurities, such as P, As, Sb, Bi, etc. which is lower than the N+ impurities are implanted into the exposed channel-doped semiconductor layer 214b of the PMOS TFT and the exposed semiconductor layer 224 of the NMOS TFT using the gate electrode 213 of the PMOS TFT and the gate electrode 223 of the NMOS TFT as masks to thereby define the channel-doped channel 214b of the PMOS TFT overlapping the gate electrode 213 of the PMOS TFT and the channel 224b of the NMOS TFT overlapping the gate electrode 223 of the NMOS TFT, so that the exposed channel-doped semiconductor layer of the PMOS TFT and the exposed semiconductor layer 224 of the NMOS TFT have the impurity concentration of $5E^{18}$ atoms/cm$^3$ to $2E^{19}$ atoms/cm$^3$, preferably the impurity concentration of $1E^{19}$ atoms/cm$^3$. Afterwards, LDD regions 224d of the NMOS TFT are formed between the channel 224b and the source and drain regions 224a and 224c of the NMOS TFT.

Figure 3E:
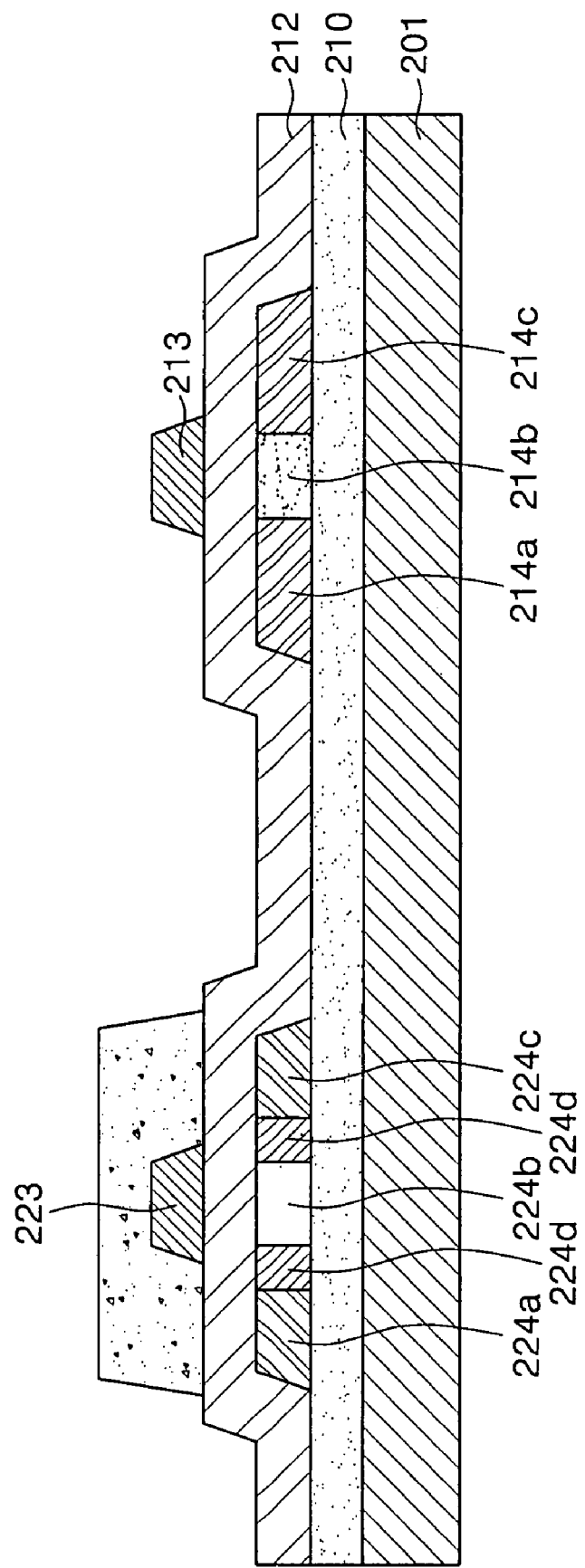

Referring to FIG. 3E, a photoresist pattern 280 covering the entire regions of the semiconductor layers 224a to 224d of the NMOS TFT and a region except for the region where the source and drain regions of the PMOS TFT will be formed is formed on the substrate 201 where the LDD regions 224d of the NMOS TFT are formed by a photolithography process employing a third mask. Sequentially, P+ impurities, such as B, Al, Ga, In, etc. are implanted into the region where the source and drain regions of the PMOS TFT will be formed in the exposed semiconductor layer 214 of the PMOS TFT using the photoresist pattern 280 as a mask to thereby form source and drain regions 214a and 214c of the PMOS TFT, so that the source and drain regions of the PMOS TFT have the impurity concentration of $5E^{20}$ atoms/cm$^3$ to $2E^{21}$ atoms/cm$^3$, preferably the impurity concentration of $1E^{21}$ atoms/cm$^3$. Then, a stripping process is employed to remove the photoresist pattern 280.

Figure 3G:
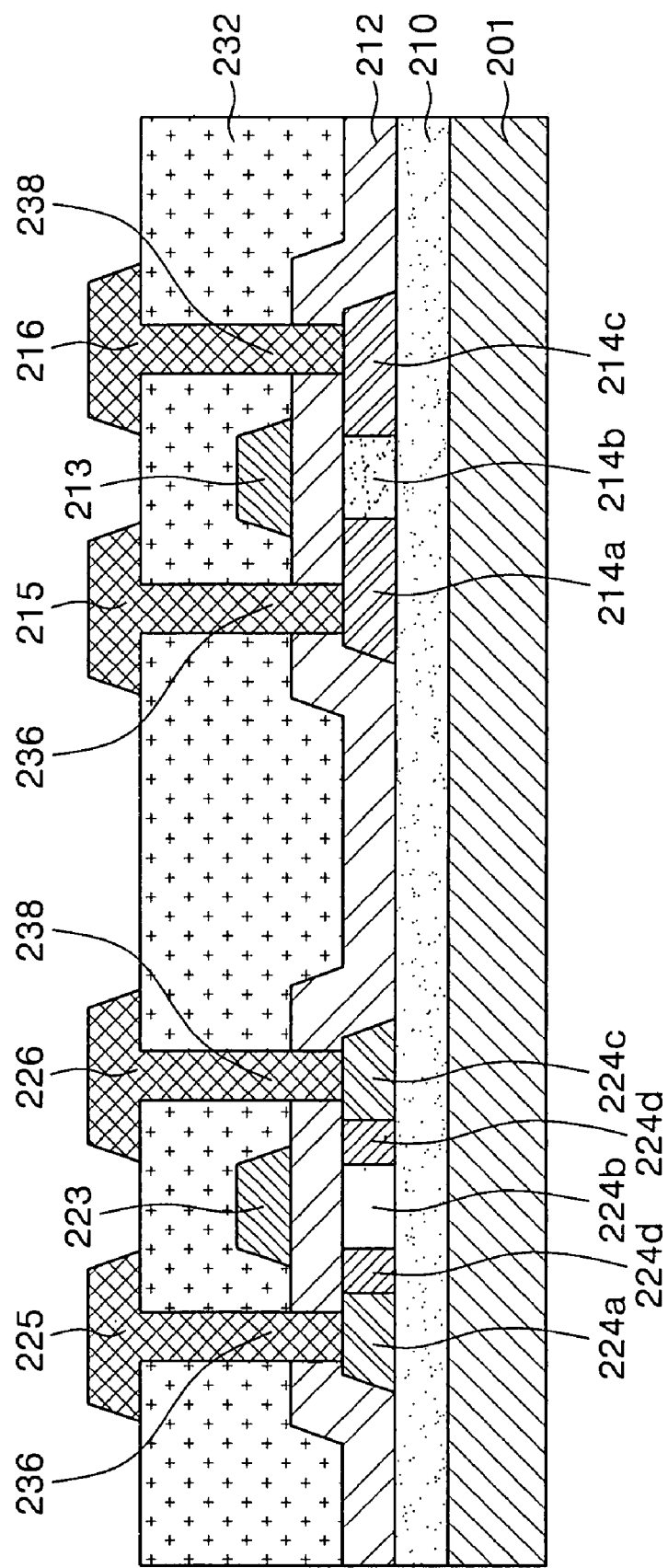

Referring to FIG. 3F, after an interlayer insulating layer 232 is formed on the entire surface of the substrate 201 where the source and drain regions 214a and 214c of the PMOS TFT are formed, source contact holes 236 and drain contact holes 238 exposing the source and drain regions 214a and 214c of the PMOS TFT and the source and drain regions 224a and 224c of the NMOS TFT are formed through the gate insulating later 212 and the interlayer insulating layer 232 using a fourth mask process. Then, as illustrated in FIG. 3G, source and drain electrodes 215 and 216 of the PMOS TFT connected to the source and drain regions 214a and 214c of the PMOS TFT, and source and drain electrodes 225 and 226 of the NMOS TFT connected to the source and drain regions 224a and 224c of the NMOS TFT are formed through the source and drain contact holes 236 and 238.

As described above, in the method of fabricating a CMOS TFT according to another embodiment of the present invention, the first mask having a first black matrix formed to a first thickness, a second black matrix formed to a thickness of ⅔ of the first thickness, and a third black matrix formed to a thickness of ⅓ of the first thickness is employed to form the channel-doped channel 214b of the PMOS TFT, and the source and drain regions 224a and 224c of the NMOS TFT.

Accordingly, in the method of fabricating a CMOS TFT according to another embodiment of the present invention, the CMOS TFT, in which channel doping is performed on a semiconductor layer of a PMOS TFT is formed by a five-mask process. Compared with the method of fabricating a CMOS TFT, in which channel doping is performed on the semiconductor layer of the PMOS TFT, two mask processes are reduced in the method of fabricating a CMOS TFT according to another embodiment of the present invention. As a result, in the method of fabricating a CMOS TFT according to another embodiment of the present invention, in which the channel doping is performed on the semiconductor layer of the PMOS TFT, it is possible to simplify manufacturing processes and to reduce the CMOS TFT manufacturing costs.

As described above, in a method of fabricating a CMOS TFT according to an exemplary embodiment of the present invention, the CMOS TFT, in which channel doping is performed on a semiconductor layer of a PMOS TFT or an NMOS TFT can be formed by a five-mask process. Therefore, compared with the method of fabricating a CMOS TFT, in which the channel doping is performed on the semiconductor layer of the NMOS TFT or the PMOS TFT, one mask process is reduced in the method of fabricating a CMOS TFT according to an exemplary embodiment of the present invention, in which the channel doping is performed on the semiconductor layer of the NMOS TFT or the PMOS TFT. As a result, in the method of fabricating a CMOS TFT of the present invention, in which the channel doping is performed on the semiconductor layer of the NMOS TFT or the PMOS TFT, it is possible to simplify the manufacturing processes, and to reduce the CMOS TFT manufacturing costs.

Although the present invention has been described with reference to certain exemplary embodiments thereof, it will be understood by those skilled in the art that a variety of modifications and variations may be made to the present invention without departing from the spirit or scope of the present invention as defined in the appended claims.

What is claimed is:

1. A method of fabricating a Complementary Metal-Oxide Semiconductor (CMOS) Thin Film Transistor (TFT), comprising:
    forming a buffer layer on an entire surface of a substrate;
    forming a polysilicon layer and a photoresist layer on the entire surface of the substrate having the buffer layer;
    exposing and developing the photoresist layer to form a first photoresist pattern having a first thickness in a first region where a semiconductor layer of a first TFT is to be formed, a second thickness in a second region where a channel and a Lightly Doped Drain (LDD) region of a second TFT is to be formed, and a third thickness in a third region where source and drain regions of the second TFT is to be formed;
    etching the polysilicon layer using the first photoresist pattern as a mask to form the semiconductor layer of the first TFT and the semiconductor layer of the second TFT;
    performing a first ashing process on the first photoresist pattern to form a second photoresist pattern where the third region having the third thickness has been removed from the first photoresist pattern;
    implanting a first impurity into the source and drain regions of the second TFT using the second photoresist pattern as a mask;
    performing a second ashing process on the second photoresist pattern to form a third photoresist pattern where the second region having the second thickness has been removed from the first photoresist pattern; and
    implanting a second impurity into the second TFT using the third photoresist pattern as a mask to perform channel doping on the second TFT.

2. The method according to claim 1, further comprising:
    forming a gate insulating layer on the entire surface of the substrate where the semiconductor layer of the first TFT, the channel-doped semiconductor layer of the first TFT, and the source and drain regions of the second TFT have been formed;
    forming a gate electrode of the first TFT overlapping a fourth region where the channel of the first TFT is to be formed over the gate insulating layer, and a gate electrode of the second TFT overlapping a fifth region where the channel of the second TFT layer is to be formed over the gate insulating layer;
    implanting a third impurity into the semiconductor layer of the second TFT using the gate electrode of the second TFT as a mask to form the LDD region of the second TFT, and to define the channel of the second TFT;
    forming a photoresist pattern entirely covering the semiconductor layer of the second TFT and covering the gate electrode of the first TFT;
    implanting a fourth impurity into the first TFT using the photoresist pattern as a mask to form the source and drain regions of the first TFT;
    forming an interlayer insulating layer on the entire surface of the substrate where the source and drain regions of the first TFT have been formed;
    forming source and drain contact holes exposing the source and drain regions of the first and second TFTs through the gate insulating layer and the interlayer insulating layer; and
    forming source and drain electrodes of the first and second TFTs connected to the source and drain regions of the First and second TFTs through the source and drain contact holes.

3. The method according to claim 1, wherein the second thickness is ⅔ that of the first thickness, and the third thickness is ⅓ that of the first thickness.

4. The method according to claim 1, wherein a mask is arranged on the entire surface of the substrate having the polysilicon layer and the photoresist layer, the mask having a first black matrix corresponding to the first region where the semiconductor layer of the first TFT is to be formed, a second black matrix corresponding to the second region where the channel and the LDD region of the second TFT are to be formed, and a third black matrix corresponding to the third region where the source and drain regions of the second TFT are to be formed.

5. The method according to claim 4, wherein the mask comprises the first black matrix having a light-shielding layer formed to a first thickness, the second black matrix having a light-shielding layer formed to a thickness of ⅔ of the first thickness, and the third black matrix having a light-shielding layer formed to a thickness of ⅓ of the first thickness.

6. The method according to claim 4, wherein the mask comprises the third black matrix having light-shielding slits formed to have a first interval, the second black matrix having light-shielding slits formed to have an interval of ⅔ of the first interval, and the first black matrix having light shielding slits formed to have an interval of ⅓ of the first interval.

7. The method according to claim 2, wherein the first impurity comprises at least one of phosphorus (P), arsenic (As), antimony (Sb) and bismuth (Bi).

8. The method according to claim 2, wherein the second impurity comprises phosphorus (P) or boron (B).

9. The method according to claim 2, wherein the third impurity comprises at least one of phosphorus (P), arsenic (As), antimony (Sb) and bismuth (Bi), and has a lower dosage than that of the first impurity.

10. The method according to claim 2, wherein the fourth impurity comprises at least one of boron (B), aluminum (Al), gallium (Ga) and indium (In).

11. The method according to claim 1, wherein the first TFT is formed as a P-channel Metal-Oxide Semiconductor (PMOS) TFT, and the second TFT is formed as an N-channel Metal-Oxide Semiconductor (NMOS) TFT.

12. A method of fabricating a Complementary Metal-Oxide Semiconductor (CMOS) Thin Film Transistor (TFT), comprising:
    forming a buffer layer on an entire surface of a substrate;
    forming a polysilicon layer and a photoresist layer on the entire surface of the substrate having the buffer layer;
    exposing and developing the photoresist layer to form a first photoresist pattern having a first thickness in a first region where a channel and a Lightly Doped Drain (LDD) region of a second TFT is to be formed, a second thickness in a second region where a semiconductor layer of a first TFT is to be formed, and a third thickness in a third region where source and drain regions of the second TFT is to be formed;
    etching the polysilicon layer using the first photoresist pattern as a mask to form the semiconductor layer of the first TFT and the semiconductor layer of the second TFT;
    performing a first ashing process on the first photoresist pattern to form a second photoresist pattern where the third region having the third thickness has been removed from the first photoresist pattern;
    implanting a first impurity into the source and drain regions of the second TFT using the second photoresist pattern as a mask;
    performing a second ashing process on the second photoresist pattern to form a third photoresist pattern where the second region having the second thickness has been removed from the first photoresist pattern; and
    implanting a second impurity into the first TFT using the third photoresist pattern as a mask to perform channel doping on the first TFT.

13. The method according to claim 12, further comprising:
    forming a gate insulating layer on the entire surface of the substrate where the channel-doped semiconductor layer of the first TFT and the source and drain regions of the second TFT have been formed;
    forming a gate electrode of the first TFT overlapping a fourth region where a channel of the first TFT is to be formed over the gate insulating layer, and a gate electrode of the second TFT overlapping a fifth region where the channel of the second TFT is to be formed;
    implanting a third impurity into the semiconductor layer of the second TFT using the gate electrode of the second TFT as a mask to form the LDD region of the second TFT and to define the channel of the second TFT;
    forming a photoresist pattern entirely covering the semiconductor layer of the second TFT and covering the gate electrode of the first TFT;
    implanting a fourth impurity into the first TFT using the photoresist pattern as a mask to form source and drain regions of the first TFT;
    forming an interlayer insulating layer on the entire surface of the substrate where the source and drain regions of the first TFT have been formed;
    forming source and drain contact holes exposing the source and drain regions of the first and second TFTs through the gate insulating layer and the interlayer insulating layer; and
    forming source and drain electrodes of the first and second TFTs connected to the source and drain regions of the first and second TFTs through the source and drain contact holes.

14. The method according to claim 12, wherein the second thickness is ⅔ that of the first thickness, and the third thickness is ⅓ that of the first thickness.

15. The method according to claim 12, wherein a mask is arranged on the entire surface of the substrate having the polysilicon layer and the photoresist layer, the mask having a first black matrix corresponding to the first region where the channel and the LDD region of the second TFT are to be formed, a second black matrix in a region corresponding to the second region where the semiconductor layer of the first TFT is to be formed, and a third black matrix in a region corresponding to the third region where the source and drain regions of the second TFT are to be formed.

16. The method according to claim 15, wherein the mask comprises the first black matrix having a light-shielding layer formed to a first thickness, the second black matrix having a light-shielding layer formed to a thickness of ⅔ of the first thickness, and the third black matrix having a light-shielding layer formed to a thickness of ⅓ of the first thickness.

17. The method according to claim 14, wherein the mask comprises the third black matrix having light-shielding slits formed to have a first interval, the second black matrix having light-shielding slits formed to have an interval of ⅔ of the first interval, and the first black matrix having light-shielding slits formed to have an interval of ⅓ of the first interval.

18. The method according to claim 12, wherein the first impurity comprises at least one of phosphorus (P), arsenic (As), antimony (Sb) and bismuth (Bi).

19. The method according to claim 13, wherein the second impurity comprises phosphorus (P) or boron (B).

20. The method according to claim 13, wherein the third impurity comprises at least one of phosphorus (P), arsenic (As), antimony (Sb) and bismuth (Bi), and has a lower dosage than that of the first impurity.

21. The method according to claim 13, wherein the fourth impurity comprises at least one of boron (B), aluminum (Al), gallium (Ga) and indium (In).

22. The method according to claim 12, wherein the first TFT is formed as a P-channel Metal-Oxide Semiconductor (PMOS) TFT, and the second TFT is formed as an N-channel Metal-Oxide Semiconductor (NMOS) TFT.

* * * * *